(12) United States Patent
Zeng

(10) Patent No.: US 10,991,785 B2
(45) Date of Patent: Apr. 27, 2021

(54) DOUBLE-SIDED DISPLAY PANEL, FABRICATING METHOD OF SAME, AND DISPLAY DEVICE

(71) Applicant: Shenzhen China Star Optoelectronics Semiconductor Display Technology Co., Ltd., Shenzhen (CN)

(72) Inventor: Weijing Zeng, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 2 days.

(21) Appl. No.: 16/605,211

(22) PCT Filed: Sep. 29, 2019

(86) PCT No.: PCT/CN2019/108927
§ 371 (c)(1),
(2) Date: Oct. 15, 2019

(87) PCT Pub. No.: WO2020/237952
PCT Pub. Date: Dec. 3, 2020

(65) Prior Publication Data
US 2020/0381501 A1    Dec. 3, 2020

(30) Foreign Application Priority Data

May 31, 2019    (CN) .......................... 201910469452.7

(51) Int. Cl.
*H01L 27/32*    (2006.01)
*H01L 51/52*    (2006.01)
(Continued)

(52) U.S. Cl.
CPC ...... *H01L 27/3267* (2013.01); *H01L 27/3246* (2013.01); *H01L 27/3248* (2013.01);
(Continued)

(58) Field of Classification Search
CPC ..... H01L 27/28; H01L 27/32; H01L 27/3202; H01L 27/3209; H01L 27/3241;
(Continued)

(56) References Cited

U.S. PATENT DOCUMENTS 7,936,421 B2    5/2011    Chae
9,786,722 B1    10/2017    Tang
(Continued)

FOREIGN PATENT DOCUMENTS

| CN | 1610460 | 4/2005 |
|---|---|---|
| CN | 201812823 | 4/2011 |

(Continued)

*Primary Examiner* — Cheung Lee

(57) ABSTRACT

A double-sided display panel and a method of fabricating the same are provided. The double-sided display panel is an organic light emitting diode (OLED) device with two structures of bottom emission and top emission on a single thin film transistor (TFT) substrate. An OLED display mode combines two different driving structures of active matrix organic light emitting diodes and passive matrix organic light emitting diodes, such that an OLED display realizes double-sided display performance, and has a high-resolution performance on one side and a basic display performance on another side.

5 Claims, 4 Drawing Sheets

(51) Int. Cl.
*H01L 51/56* (2006.01)
*H01L 51/00* (2006.01)

(52) U.S. Cl.
CPC ...... *H01L 51/0021* (2013.01); *H01L 51/5206* (2013.01); *H01L 51/5221* (2013.01); *H01L 51/5253* (2013.01); *H01L 51/5259* (2013.01); *H01L 51/56* (2013.01); *H01L 2227/323* (2013.01); *H01L 2251/5315* (2013.01); *H01L 2251/5323* (2013.01)

(58) Field of Classification Search
CPC ............ H01L 27/3244; H01L 27/3246; H01L 27/3248; H01L 27/3258; H01L 27/326; H01L 27/3267; H01L 27/3286; H01L 51/0021; H01L 51/50; H01L 51/5012; H01L 51/52; H01L 51/5203; H01L 51/5206; H01L 51/5221; H01L 51/5237; H01L 51/5253; H01L 51/5259; H01L 51/56; H01L 2227/323; H01L 2251/5315; H01L 2251/5323
See application file for complete search history.

(56) References Cited

U.S. PATENT DOCUMENTS

| | | |
|---|---|---|
| 2003/0227254 A1 | 12/2003 | Terumoto |
| 2004/0263056 A1 | 12/2004 | Seo et al. |
| 2017/0271417 A1 | 9/2017 | Jia et al. |
| 2020/0161576 A1* | 5/2020 | Hsu ..................... H01L 27/3246 |
| 2020/0183206 A1 | 6/2020 | Li |

FOREIGN PATENT DOCUMENTS

| | | |
|---|---|---|
| CN | 105789256 | 7/2016 |
| CN | 205645816 | 10/2016 |
| CN | 107331687 | 11/2017 |
| CN | 109585507 | 4/2019 |

* cited by examiner

DOUBLE-SIDED DISPLAY PANEL, FABRICATING METHOD OF SAME, AND DISPLAY DEVICE

RELATED APPLICATIONS

This application is a National Phase of PCT Patent Application No. PCT/CN2019/108927 having International filing date of Sep. 29, 2019, which claims the benefit of priority of Chinese Patent Application No. 201910469452.7 filed on May 31, 2019. The contents of the above applications are all incorporated by reference as if fully set forth herein in their entirety.

FIELD AND BACKGROUND OF THE INVENTION

The present disclosure relates to the field of organic light emitting diode (OLED) display technologies, and more particularly to a double-sided display panel, a fabricating method of the same, and a display device.

Organic light emitting diodes (OLEDs) have self-illumination, high brightness, wide viewing angles, high contrast, flexibility, low energy consumption, etc., therefore, OLEDs have received extensive attention and as a new generation of display methods. OLEDs have gradually replaced traditional liquid crystal displays (LCDs) and are widely used in mobile phone screens, computer monitors, full color televisions (TVs), etc. OLEDs can be classified into a top emission type and a bottom emission type according to characteristics of light emission, and the OLEDs have characteristics of being thin and light.

How to maximize the characteristics of OLEDs and make OLED products more attractive is a problem that OLED manufacturers are thinking about.

SUMMARY OF THE INVENTION

An object of an embodiment of the present disclosure is to provide a double-sided display panel and a method of fabricating the same. The double-sided display panel is an organic light emitting diode (OLED) device with two structures of bottom emission and top emission on a single thin film transistor (TFT) substrate. An OLED display mode combines two different driving structures of active matrix organic light emitting diodes and passive matrix organic light emitting diodes, such that an OLED display realizes double-sided display performance, and has a high-resolution performance on one side and a basic display performance on another side. In addition, because an inverted OLED device structure is disposed on the top emission structure side of the double-sided display panel, voltage drop (referred to as IR-drop) displayed on the side can be effectively reduced. Furthermore, the double-sided display panel utilizes a top-emitting and bottom-emitting OLED device structure, and a thickness of each film layer of the OLED device is small, such that the double-sided display panel does not increase its panel thickness to achieve ultra-thin display.

According to an aspect of an embodiment of the present disclosure, the embodiment of the present disclosure provides a double-sided display panel. The double-sided display panel includes a base substrate, a thin film transistor array disposed on the base substrate, a first anode disposed on the thin film transistor array, a first organic layer disposed on the first anode, a first cathode disposed on the first organic layer, an interlayer insulating layer disposed on the first cathode, a second cathode disposed on the interlayer insulating layer, a second organic layer disposed on the second cathode, and a second anode disposed on the second organic layer. The second cathode is strip-shaped, the second anode is strip-shaped, and a projection of the second anode on the second cathode is perpendicular to the second cathode.

In an embodiment of the present disclosure, the double-sided display panel further includes a package structure disposed on the second anode.

In an embodiment of the present disclosure, the double-sided display panel further includes a pixel defining layer disposed between the second cathode and the second organic layer.

In an embodiment of the present disclosure, the first cathode and the second cathode are each made of a non-transmissive metal material.

In an embodiment of the present disclosure, the first anode and the second anode are each made of a light transmissive material.

In an embodiment of the present disclosure, the package structure is an inorganic/organic laminated thin film encapsulation structure or a glass/glass encapsulation structure.

In an embodiment of the present disclosure, the base substrate is a flexible substrate.

According to another aspect of an embodiment of the present disclosure, the embodiment of the present disclosure provides a method of fabricating the above double-sided display panel. The method includes providing the base substrate and forming a thin film transistor on the base substrate, forming the first anode on the thin film transistor, forming the first organic layer and the first cathode on the first organic layer by vacuum evaporation or solution film formation on the first anode and the thin film transistor, forming the interlayer insulating layer by chemical vapor deposition on the first cathode, and forming the second cathode and the second organic layer disposed on the second cathode by vacuum evaporation on the interlayer insulating layer, and forming the second anode by vacuum sputtering. The second cathode is strip-shaped, the second anode is strip-shaped, and the projection of the second anode on the second cathode is perpendicular to the second cathode.

In an embodiment of the present disclosure, after forming the second cathode, the second organic layer, and the second anode, the method further includes forming the package structure on the second anode.

In an embodiment of the present disclosure, the package structure is an inorganic/organic laminated thin film package structure formed by chemical vapor deposition.

In an embodiment of the present disclosure, the package structure is a glass/glass package structure formed by a frame/desiccant filling method.

In an embodiment of the present disclosure, in steps of forming the second cathode and the second organic layer to be formed, the method further includes forming a pixel definition layer printing on the second cathode by evaporation or inkjet printing.

According to another aspect of an embodiment of the present disclosure, the embodiment of the present disclosure provides a display device including the above double-sided display panel.

Advantages of the embodiment of the present disclosure are that the double-sided display panel is an organic light emitting diode (OLED) device with two structures of bottom emission and top emission on a single thin film transistor (TFT) substrate. An OLED display mode combines two different driving structures of active matrix organic light emitting diodes and passive matrix organic light emitting diodes, such that an OLED display realizes double-sided display performance, and has a high-resolution performance on one side and a basic display performance on another side. In addition, because an inverted OLED device structure is disposed on the top emission structure side of the double-sided display panel, voltage drop (referred to as IR-drop) displayed on the side can be effectively reduced. Furthermore, the double-sided display panel utilizes a top-emitting and bottom-emitting OLED device structure, and a thickness of each film layer of the OLED device is small, such that the double-sided display panel does not increase its panel thickness to achieve ultra-thin display. In addition, the double-sided display panel adopts a combination of active matrix organic light emitting diodes and passive matrix organic light emitting diodes, which is convenient for preparation and has mass production operability.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
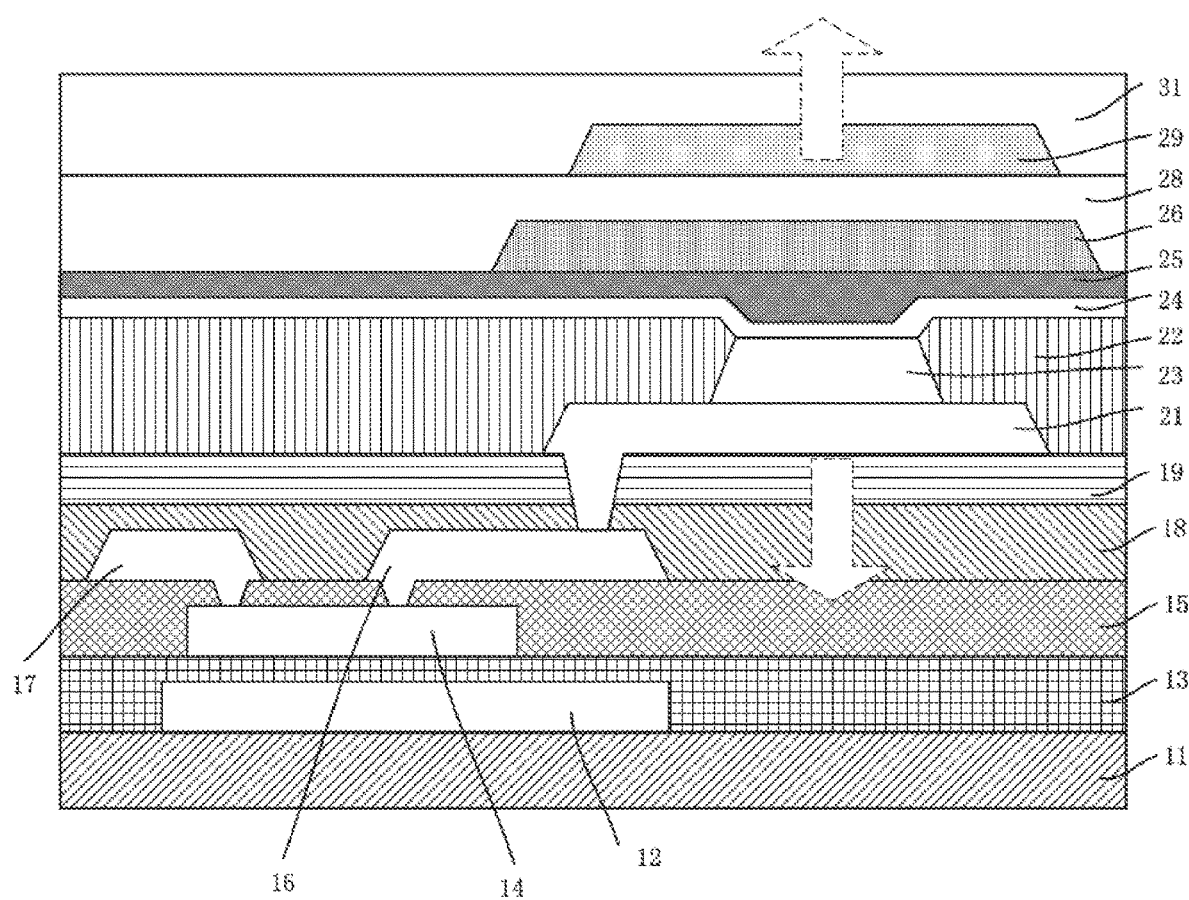
FIG. 1 is a schematic structural diagram of a double-sided display panel according to a first embodiment of the present disclosure.

The technical solutions in the embodiments of the present disclosure will be clearly and completely described in the following with reference to the accompanying drawings.

It is apparent that the described embodiments are only a part of the embodiments of the present disclosure, and not all of the embodiments. All other embodiments obtained by a person skilled in the art based on the embodiments of the present disclosure without creative efforts are within the scope of the present disclosure.

The terms "first", "second", "third", etc. (if present) in the specification and claims of the present disclosure and the above figures are used to distinguish similar objects and are not necessarily used to describe a particular order or prioritization. It is understood that the objects so described are interchangeable where appropriate. Moreover, the terms "including," "having," and any variants thereof is intended to cover non-exclusive inclusions.

The drawings, which are discussed below, and the various embodiments used to describe the principles of the present disclosure are intended to be illustrative only and not to limit the scope of the present disclosure. Those skilled in the art will appreciate that the principles of the present disclosure may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terminology used in the description of the present disclosure is for the purpose of description and is not intended to show the concept of the present disclosure. Expressions used in the singular encompasses the plural forms of expression unless the context clearly dictates otherwise. In the description of the present disclosure, it is to be understood that the terms such as "including," "having," and "containing" is intended to illustrate the possibility of having the features, numbers, steps, actions, or combinations thereof disclosed in the description of the present disclosure, and in not intended to exclude the possibility that one or more other features, numbers, steps, acts or combinations may be added. The same reference numerals in the drawings denote the same parts.

Referring to FIG. 1, in accordance with an aspect of an embodiment of the present disclosure, the embodiment of the present disclosure provides a double-sided display panel. In this embodiment, the double-sided display panel is a double-sided display organic light emitting diode (OLED) display panel. The panel includes a base substrate 11, a thin film transistor array (not shown) disposed on the base substrate 11, a first anode 21 disposed on the thin film transistor array, a first organic layer 23 disposed on the first anode 21, a first cathode 24 disposed on the first organic layer 23, an interlayer insulating layer 25 disposed on the first cathode 24, a second cathode 26 disposed on the interlayer insulating layer 25, a second organic layer 28 disposed on the second cathode 26, and a second anode 29 disposed on the second organic layer 28. The second cathode 26 is strip-shaped, the second anode 29 is strip-shaped, and a projection of the second anode 29 on the second cathode 26 is perpendicular to the second cathode 26.

In details, the base substrate 11 is a flexible substrate, such as a PI substrate. It is understood that, in other embodiments, the base substrate 11 may also be a glass substrate or a plastic substrate.

A buffer layer (not shown) is disposed on the base substrate 11. A thin film transistor array is disposed on the buffer layer. The thin film transistor array includes a gate electrode 12, a gate insulating layer 13, an active layer 14, an etch barrier layer 15, a source/drain (i.e., a source 16 and a drain 17), a passivation layer 18, and an organic planarization layer 19 which are sequentially stacked.

A first anode 21 is further disposed on the thin film transistor array. The first anode 21 is made of a light transmissive material, such as indium tin oxide (ITO) or indium zinc oxide (IZO).

A pixel defining layer 22 is disposed on the first anode 21. The first organic layer 23 is provided on an opening of the pixel defining layer 22 and on the first anode 21. The first organic layer 23 serves as a first light emitting unit, and includes a hole injection layer HIL, a hole transport layer HTL, an organic light emitting layer EML, an electron transport layer ETL, and an electron injection layer EIL, which are not shown in the drawings.

The first cathode 24 is disposed on the first organic layer 23. The first cathode 24 is provided over an entire surface and is made of a non-transmissive metal material, such as aluminum, silver, or the like.

The interlayer insulating layer 25 is provided on the first cathode 24. The second cathode 26, the second organic layer 28, and the second anode 29 are laminated on the interlayer insulating layer 25 in this order. The second cathode 26 is made of a non-transmissive metal material, such as aluminum, silver, or the like. The second organic layer 28 serves as a second light emitting unit including a hole injection layer HIL, a hole transport layer HTL, an organic light emitting layer EML, an electron transport layer ETL, and an electron injection layer EIL. The second anode 29 is made of a light transmissive material, such as indium tin oxide (ITO) or indium zinc oxide (IZO). The second cathode 26 has a strip shape, the second anode 29 has a strip shape, and the projection of the second anode 29 on the second cathode 26 is perpendicular to the second cathode 26.

Figure 2:
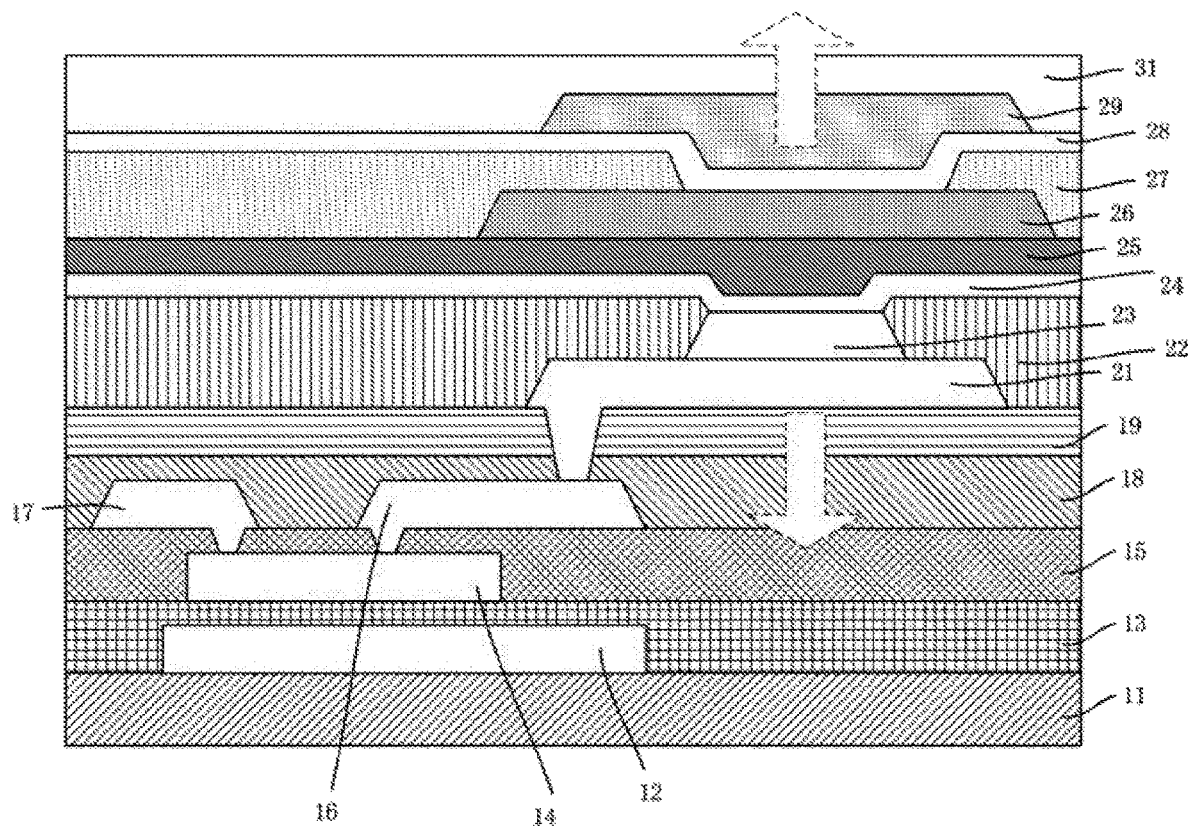
FIG. 2 is a schematic structural diagram of a double-sided display panel according to a second embodiment of the present disclosure.

Referring to FIG. 2, optionally, in the second embodiment, the double-sided display panel further includes a pixel defining layer 27 disposed between the second cathode 26 and the second organic layer 28. The structure of the double-sided display panel in the second embodiment is the same as that of the double-sided display panel in the first embodiment, except that the pixel defining layer 27 interposed between the second cathode 26 and the second organic layer 28 is added in addition to the second embodiment.

Referring to FIG. 1, in the first embodiment, the double-sided display panel further includes a package structure 31 disposed on the second anode 29. The package structure 31 is an inorganic/organic laminated thin film package structure or a glass/glass package structure.

With continued reference to FIG. 1, in the double-sided display panel, the thin film transistor array, the first anode 21, the first organic layer 23, and the first cathode 24 form an active matrix organic light emitting diode (AMOLED) structure, and the second cathode 26, the second organic layer 28, and the second anode 29 forms a passive matrix organic light emitting diode (PMOLED) structure. Moreover, the AMOLED structure is an OLED device with a bottom emission structure, and the PMOLED structure is an OLED device with a top emission structure. In this embodiment, the double-sided display panel is an OLED device that forms two structures of bottom emission and top emission on a single TFT substrate. An OLED display mode combines two different driving structures of active matrix organic light emitting diodes and passive matrix organic light emitting diodes, such that an OLED display realizes double-sided display performance, and has a high-resolution performance on one side of the AMOLED and a basic display performance on one side of the PMOLED. The AMOLED side is driven by a thin film transistor array and displays light emission, thereby having a high-resolution performance, and the PMOLED side is driven and displayed by strip-shaped and vertically disposed second cathode 26 and second anode 29, thereby enabling the basic display performance.

In addition, on the top emission structure side (i.e., the PMOLED structure), an inverted OLED device structure is employed, such that a direct current (DC) voltage drop (i.e., IR drop) displayed on the side can be effectively reduced.

In addition, the double-sided display panel of the embodiment of the present disclosure only needs to provide a substrate for carrying TFTs and utilizes top-emitting and bottom-emitting OLEDs compared to the conventional double-sided display panel structure formed by using two upper and lower substrates for carrying TFTs. The device structure, and the thickness of each film layer of the OLED device is small, such that the double-sided display panel does not increase the thickness of the panel to achieve ultra-thin display.

Figure 3:
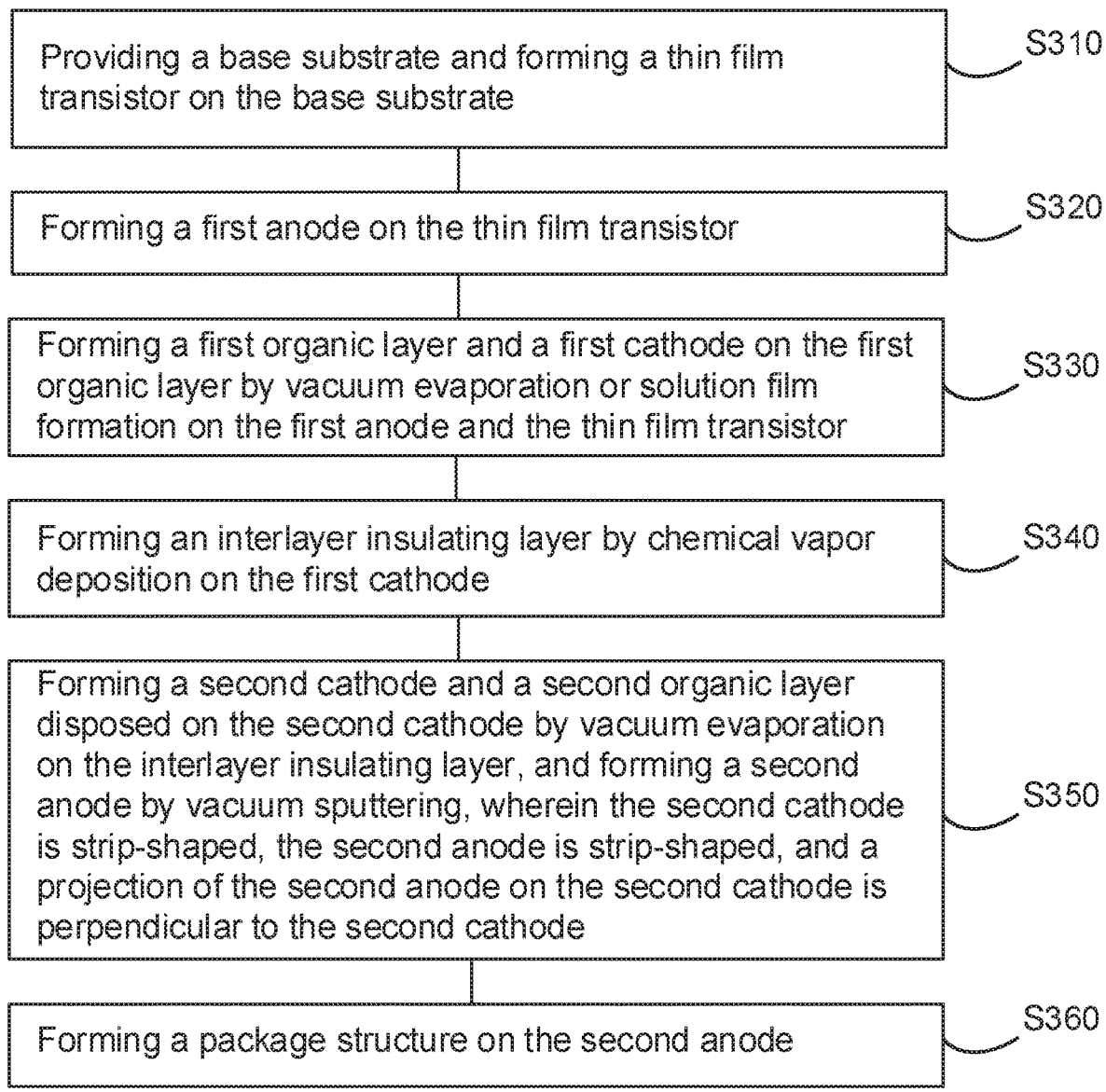
FIG. 3 is a flowchart illustrating a method of fabricating the double-sided display panel according to the first embodiment of the present disclosure.

FIG. 3 is a flowchart illustrating a method of fabricating the double-sided display panel according to the first embodiment of the present disclosure.

According to another aspect of an embodiment of the present disclosure, the embodiment of the present disclosure provides a method of fabricating the above double-sided display panel. The method includes the following steps.

Step S310, providing a base substrate and forming a thin film transistor on the base substrate is provided.

In details, the base substrate 11 is a flexible substrate such as a PI substrate. It is understood that, in other embodiments, the base substrate 11 may also be a glass substrate or a plastic substrate. A buffer layer is disposed on the substrate. A thin film transistor array is disposed on the buffer layer. The thin film transistor array includes a gate electrode 12, a gate insulating layer 13, an active layer 14, an etch barrier layer 15, a source/drain (a source 16 and a drain 17), a passivation layer 18, and an organic planarization layer 19.

Step S320, forming a first anode on the thin film transistor is provided.

The first anode 21 is made of a light transmissive material, such as indium tin oxide (ITO) or indium zinc oxide (IZO).

Step S330, forming a first organic layer and a first cathode on the first organic layer by vacuum evaporation or solution film formation on the first anode and the thin film transistor is provided.

A first organic layer 23 is disposed on the first anode 21. The first organic layer 23 serves as a first light emitting unit including a hole injection layer HIL, a hole transport layer HTL, an organic light emitting layer EML, an electron transport layer ETL, and an electron injection layer EIL.

A first cathode 24 is disposed on the first organic layer 23. The first cathode 24 is provided over an entire surface and is made of a non-transmissive metal material, such as aluminum, silver, or the like.

Step S340, forming an interlayer insulating layer by chemical vapor deposition on the first cathode is provided.

Step S350, forming a second cathode and a second organic layer disposed on the second cathode by vacuum evaporation on the interlayer insulating layer is provided, and forming a second anode by vacuum sputtering is provided. The second cathode is strip-shaped, the second anode is strip-shaped, and a projection of the second anode on the second cathode is perpendicular to the second cathode.

An interlayer insulating layer 25 is provided on the first cathode 24. A second cathode 26, a second organic layer 28, and a second anode 29 are laminated on the interlayer insulating layer 25 in this order. The second cathode 26 is made of a material that is opaque to light, such as aluminum, silver, or the like. The second organic layer 28 serves as a second light emitting unit including a hole injection layer HIL, a hole transport layer HTL, an organic light emitting layer EML, an electron transport layer ETL, and an electron injection layer EIL. The second anode 29 is made of a light transmissive material, such as indium tin oxide (ITO) or indium zinc oxide (IZO). The second cathode 26 has a strip shape, the second anode 29 has a strip shape, and the projection of the second anode 29 on the second cathode 26 is perpendicular to the second cathode 26.

Figure 4:
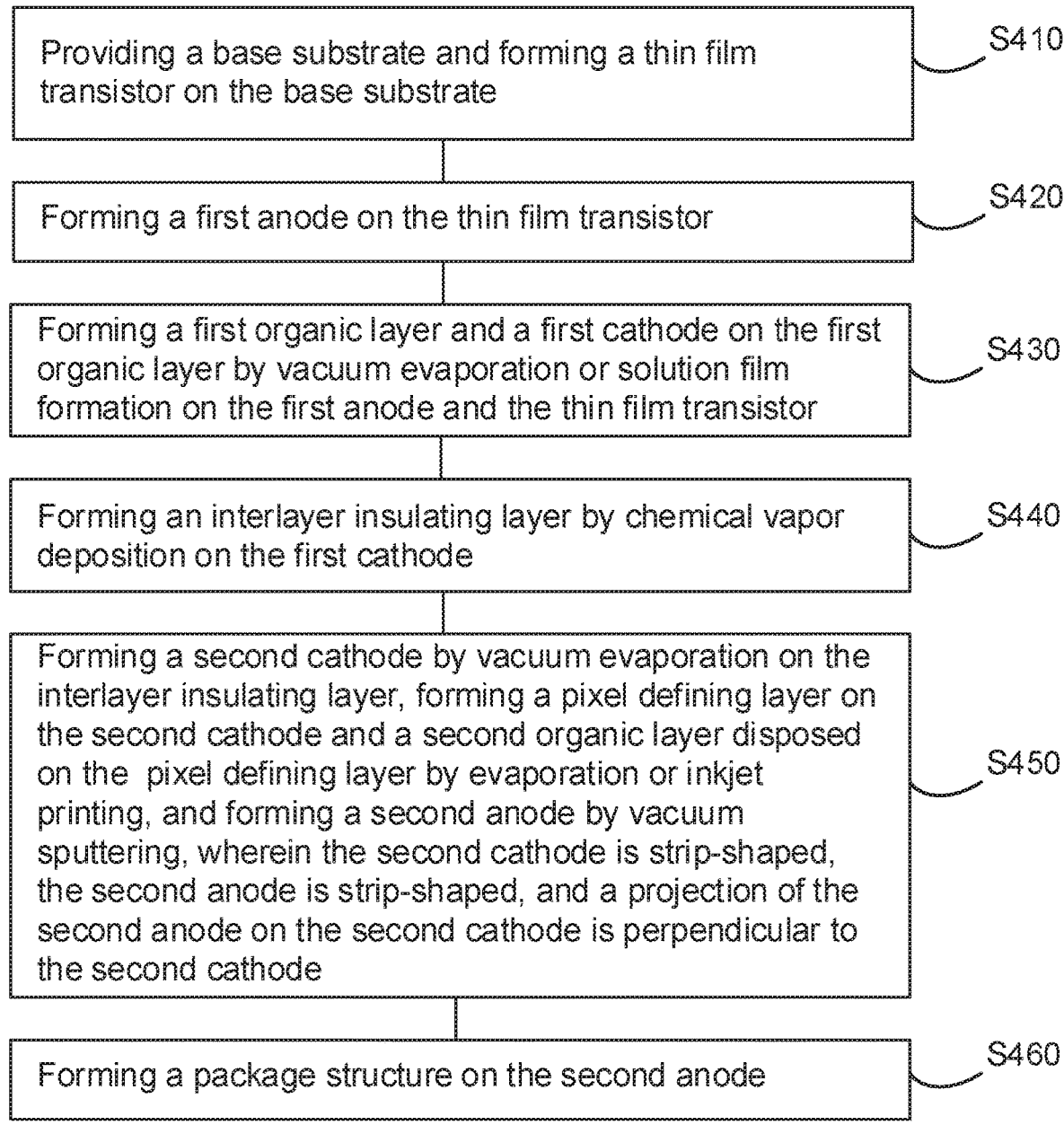
FIG. 4 is a flowchart illustrating a method of fabricating the double-sided display panel according to the second embodiment of the present disclosure.

Referring to FIG. 4, FIG. 4 is a flowchart illustrating a method of fabricating the double-sided display panel according to the second embodiment of the present disclosure. The steps of the second embodiment are substantially the same as those of the first embodiment except for the step S350. That is, steps S410 to S440 and a step S460 of the second embodiment are the same as the steps S310 to S340 and the step S360 of the first embodiment, except that the step S450 is different from the step S350. In the second embodiment, the pixel defining layer is added, and the corresponding structure of the organic film layer formed by the inject printing (IJP) film formation method is mainly used.

In details, in the step S350 of the second embodiment, in forming the second cathode and the second organic layer to be formed, the method further includes forming a pixel definition layer printing on the second cathode by evaporation or inkjet printing. That is, in the step S450, the second cathode is formed on the interlayer insulating layer by vacuum evaporation, the pixel defining layer is formed on the second cathode by evaporation or inkjet printing, the second organic layer is disposed on the pixel defining layer, and the second anode is formed by vacuum sputtering. The second cathode is in a strip shape, the second anode is in a strip shape, and a projection of the second anode on the second cathode is perpendicular to the second cathode.

Continuing to refer to FIG. 3, optionally, the method further includes a step S360 after the step S350. In the step S360, forming a package structure on the second anode is provided.

The package structure 31 may be an inorganic/organic laminated thin film package structure. When the package structure 31 is an inorganic/organic laminated thin film package structure, it is formed by chemical vapor deposition. It is understood that, in other partial embodiments, the package structure 31 is a glass/glass package structure. When the package structure is a glass/glass package structure, it is formed by a frame/desiccant filling method.

According to still another aspect of an embodiment of the present disclosure, a display device (not shown) is provided, the display device including the above-described double-sided display panel. The specific structure of the double-sided display panel will not be described herein. Since the double-sided display panel adopts two different driving structures of AMOLED and PMOLED, and can realize simplification of the process, it has operability for mass production. The display device can be used for display devices such as liquid crystal televisions, liquid crystal displays, mobile phones, and tablet computers.

Advantages of the embodiment of the present disclosure are that the double-sided display panel is an organic light emitting diode (OLED) device with two structures of bottom emission and top emission on a single thin film transistor (TFT) substrate. An OLED display mode combines two different driving structures of active matrix organic light emitting diodes and passive matrix organic light emitting diodes, such that an OLED display realizes double-sided display performance, and has a high-resolution performance on one side and a basic display performance on another side. In addition, because an inverted OLED device structure is disposed on the top emission structure side of the double-sided display panel, voltage drop (referred to as IR-drop) displayed on the side can be effectively reduced. Furthermore, the double-sided display panel utilizes a top-emitting and bottom-emitting OLED device structure, and a thickness of each film layer of the OLED device is small, such that the double-sided display panel does not increase its panel thickness to achieve ultra-thin display. In addition, the double-sided display panel adopts a combination of active matrix organic light emitting diodes and passive matrix organic light emitting diodes, which is convenient for preparation and has mass production operability.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

The subject matter of the present disclosure can be manufactured and used in the industry with industrial applicability.

What is claimed is:

1. A method of fabricating a double-sided display panel, comprising:
   providing a base substrate and forming a thin film transistor on the base substrate;
   forming a first anode on the thin film transistor;
   forming a first organic layer and a first cathode on the first organic layer by vacuum evaporation or solution film formation on the first anode and the thin film transistor;
   forming an interlayer insulating layer by chemical vapor deposition on the first cathode;
   forming a second cathode and a second organic layer on the second cathode by vacuum evaporation on the interlayer insulating layer, and forming the second anode by vacuum sputtering, wherein the second cathode is strip-shaped, the second anode is strip-shaped, and a projection of the second anode on the second cathode is perpendicular to the second cathode.

2. The method according to claim 1, wherein after forming the second cathode, the second organic layer, and the second anode, the method further comprises forming a package structure on the second anode.

3. The method according to claim 2, wherein the package structure is an inorganic/organic laminated thin film package structure formed by chemical vapor deposition.

4. The method according to claim 2, wherein the package structure is a glass/glass package structure formed by a frame/desiccant filling method.

5. The method according to claim 1, wherein in steps of forming the second cathode and the second organic layer to be formed, the method further comprises forming a pixel definition layer printing on the second cathode by evaporation or inkjet printing.

* * * * *